United States Patent
Sato et al.

(10) Patent No.: US 10,242,861 B2
(45) Date of Patent: Mar. 26, 2019

(54) PROCESSING APPARATUS, PROCESSING METHOD, AND MANUFACTURING METHOD OF ELECTRONIC DEVICE

(71) Applicant: Kabushiki Kaisha Toshiba, Minato-ku (JP)

(72) Inventors: Katsuhiro Sato, Yokkaichi (JP); Hideaki Hirabayashi, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 376 days.

(21) Appl. No.: 14/800,926

(22) Filed: Jul. 16, 2015

(65) Prior Publication Data
US 2016/0035595 A1 Feb. 4, 2016

(30) Foreign Application Priority Data
Jul. 30, 2014 (JP) .................................. 2014-154807

(51) Int. Cl.
H01L 21/67 (2006.01)
H01L 21/02 (2006.01)
B08B 3/10 (2006.01)

(52) U.S. Cl.
CPC .. H01L 21/02054 (2013.01); H01L 21/02057 (2013.01); H01L 21/67057 (2013.01); H01L 21/67086 (2013.01); B08B 3/10 (2013.01)

(58) Field of Classification Search
CPC ............................................... H01L 21/67057
See application file for complete search history.

(56) References Cited

U.S. PATENT DOCUMENTS

| 6,131,588 A | 10/2000 | Kamikawa et al. |
| 2013/0008868 A1 | 1/2013 | Uozumi et al. |
| 2016/0141170 A1 | 5/2016 | Sato et al. |

FOREIGN PATENT DOCUMENTS

| CN | 103681983 A | 3/2014 |
| JP | 9-190996 | 7/1997 |
| JP | 10-135180 | 5/1998 |
| JP | 2008-10638 | 1/2008 |

(Continued)

OTHER PUBLICATIONS

U.S. Appl. No. 14/632,302, filed Feb. 26, 2015, Katsuhiro Sato et al.

(Continued)

Primary Examiner — Jason Y Ko
(74) Attorney, Agent, or Firm — Oblon, McClelland, Maier & Neustadt, L.L.P.

(57) ABSTRACT

According to one embodiment, a processing apparatus includes a first supply section, a second supply section, a gas supply section, and a sublimation section. The first supply section supplies a first fluid on surfaces of a plurality of workpieces. The second supply section supplies a fluid containing a sublimable material on the surfaces of the plurality of workpieces to which the first fluid is supplied. The gas supply section supplies gas on the surfaces of the plurality of workpieces to which a fluid containing the sublimable material is supplied. The sublimation section sublimates a layer containing the sublimable material formed on each surface of the plurality of workpieces. The gas supply section controls a thickness of the layer containing the sublimable material formed each surface of the plurality of workpieces by controlling a flow velocity of the gas in each surface of the plurality of workpieces.

12 Claims, 5 Drawing Sheets

(56) References Cited

FOREIGN PATENT DOCUMENTS

| | | |
|---|---|---|
| JP | 2011-124313 | 6/2011 |
| JP | 2012-129294 | 7/2012 |
| JP | 2012-146696 | 8/2012 |
| JP | 2012-243869 | 12/2012 |
| JP | 2012-243869 A1 | 12/2012 |
| JP | 2013-16699 | 1/2013 |
| JP | 2013-33817 | 2/2013 |
| JP | 2013-42093 | 2/2013 |
| JP | 2013-42094 | 2/2013 |
| JP | 2013-258272 | 12/2013 |
| JP | 2015-106645 | 6/2015 |
| JP | 2016-96317 A | 5/2016 |
| TW | 406330 B | 9/2000 |

OTHER PUBLICATIONS

Combined Taiwanese Office Action and Search Report dated Oct. 31, 2016 in Patent Application No. 104123455 (with English translation).

PROCESSING APPARATUS, PROCESSING METHOD, AND MANUFACTURING METHOD OF ELECTRONIC DEVICE

CROSS-REFERENCE TO RELATED APPLICATIONS

This application is based upon and claims the benefit of priority from Japanese Patent Application No. 2014-154807, filed on Jul. 30, 2014; the entire contents of which are incorporated herein by reference.

FIELD

Embodiments described herein relate generally to a processing apparatus, processing method, and manufacturing method of electronic device.

BACKGROUND

In a manufacture of an electronic device such as a semiconductor device or a flat panel display, cleaning is performed with pure water or an organic solvent, and the like.

Here, if an interval (pitch dimension of lines in a line-space pattern) of an irregular pattern is 40 nm or less, a capillary force is generated and a convex section of the irregular pattern may be collapsed when the pure water or the organic solvent and the like used in a cleaning process is dried.

Thus, in order to suppress the collapse of the convex section of the irregular pattern, a technique using a sublimable material is proposed.

In the technique using the sublimable material, after cleaning a workpiece, melted sublimable material or a solution including the sublimable material is applied to a surface of the workpiece such as a substrate and the surface is cooled or solidified by removing the solvent, thereafter, the sublimable material is removed from the surface of the workpiece by heating the surface under the atmosphere pressure or under a reduced pressure.

In this case, if the solution and the like containing the sublimable material are applied to the surface of the workpiece using a single-wafer spin method, it is possible to appropriately make a thickness of a layer containing the sublimable material. However, if the single-wafer spin method is used, there is a problem that productivity is low.

Meanwhile, if a batch processing method for immersing a plurality of workpieces at a time using the solution containing the sublimable material and the like is used, productivity can be improved. However, when the batch processing is used, it is difficult to appropriately make the thickness of the layer containing the sublimable material.

Thus, it is desirable to develop a technique in which it is possible to appropriately make the thickness of the layer containing the sublimable material and to improve the productivity.

DETAILED DESCRIPTION

Figure 1:
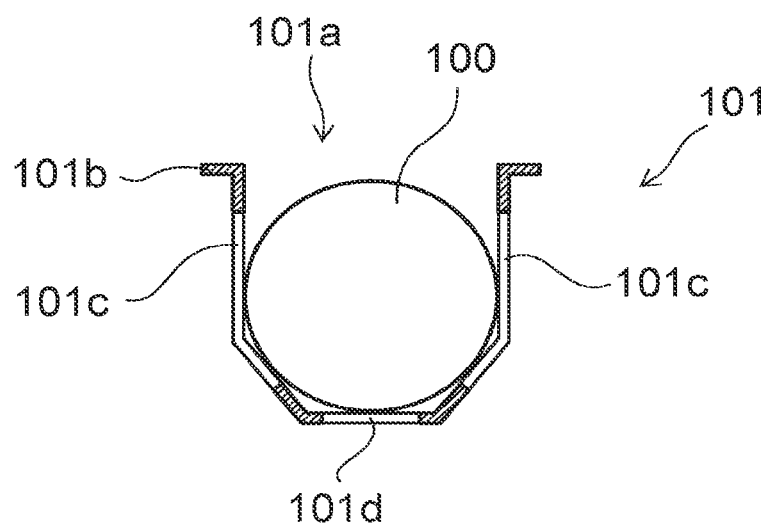
FIG. 1 is a schematic cross-sectional view illustrating a carrier 101.

In general, according to one embodiment, a processing apparatus includes a first supply section, a second supply section, a gas supply section, and a sublimation section. The first supply section that supplies a first fluid on surfaces of a plurality of workpieces. The second supply section that supplies a fluid containing a sublimable material on the surfaces of the plurality of workpieces to which the first fluid is supplied. The gas supply section that supplies gas on the surfaces of the plurality of workpieces to which a fluid containing the sublimable material is supplied. The sublimation section that sublimates a layer containing the sublimable material formed on each surface of the plurality of workpieces. Wherein the gas supply section controls a thickness of the layer containing the sublimable material formed each surface of the plurality of workpieces by controlling a flow velocity of the gas in each surface of the plurality of workpieces.

Hereinafter, an embodiment is illustrated with reference to the drawings. Moreover, the same reference numerals are given to the same configuration elements in each drawing and detailed description will be omitted.

First, a workpiece 100 and a carrier 101 are exemplified.

The workpiece 100 can have fine irregular portions on a surface thereof.

For example, the workpiece 100 can be a semiconductor wafer on which an irregular pattern is formed on a surface thereof.

In this case, for example, the irregular pattern can be a line-space pattern. For example, a pitch dimension of the lines can be 40 nm or less.

In the following description, as an example, an example in which the workpiece 100 is the semiconductor wafer will be described.

However, the workpiece 100 is not limited to the semiconductor wafer and may be a member having fine irregular portions on a surface thereof.

FIG. 1 is a schematic cross-sectional view illustrating a carrier 101.

Figure 2:
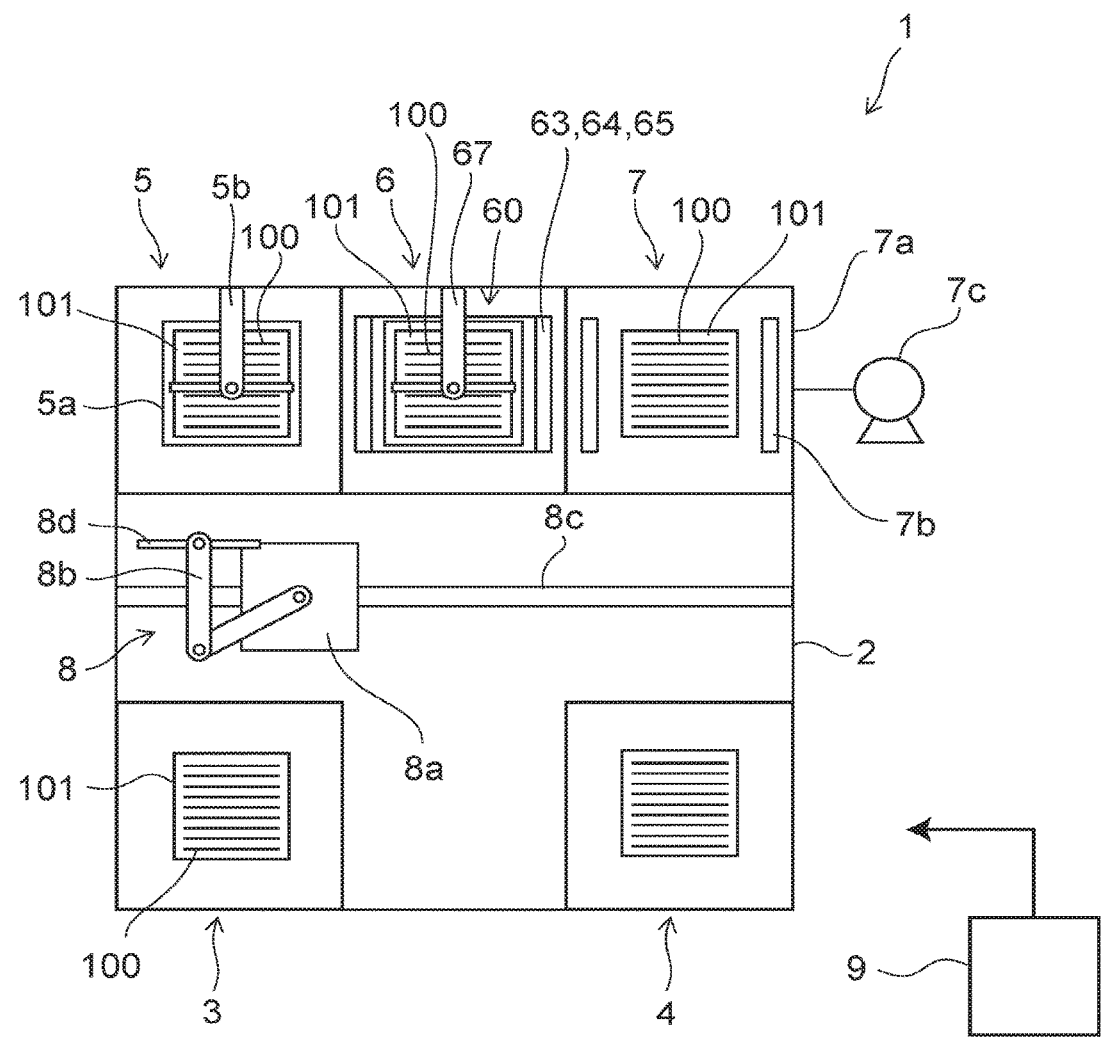
FIG. 2 is a schematic view illustrating the processing apparatus 1 according to the embodiment.

The carrier 101 houses a plurality of workpieces 100 in a state where the plurality of workpieces 100 are upright at predetermined intervals (see FIG. 2).

Furthermore, as illustrated in FIG. 1, the carrier 101 has a box shape.

An opening 101a is provided in an upper end portion of the carrier 101. The workpiece 100 is inserted and removed through the opening 101a.

Furthermore, a holding section 101b is provided in an upper end portion of the carrier 101.

The holding section 101b protrudes from the upper end portion of the carrier 101 to the outside.

The holding section 101b is held by a transport section or a lifting section when moving the carrier 101.

An opening 101c is provided in a side surface of the carrier 101.

An opening 101d is provided in a bottom surface of the carrier 101.

A material of the carrier 101 is not specifically limited, but it is preferable to have a chemical resistance and a heat resistance. For example, the material of the carrier 101 can be fluorine resin or stainless steel, and the like.

Moreover, the carrier 101 is not limited to the examples. The carrier 101 can house the plurality of workpieces 100 in a state where the plurality of workpieces 100 are upright at the predetermined intervals.

Next, a processing apparatus 1 according to the embodiment is exemplified.

FIG. 2 is a schematic view illustrating the processing apparatus 1 according to the embodiment.

Figure 3:
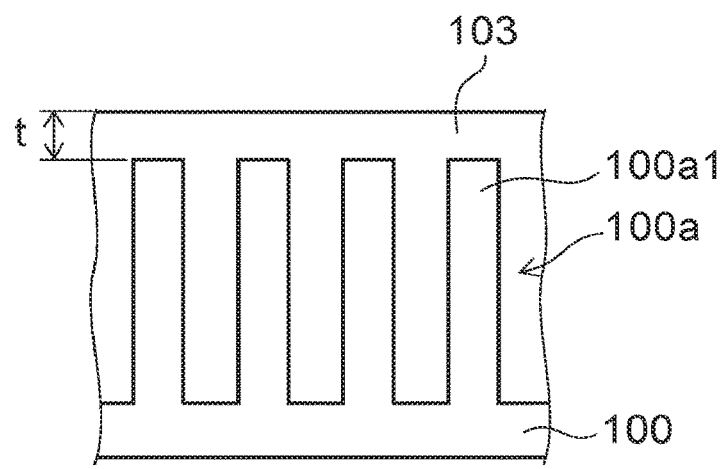
FIG. 3 is a schematic cross-sectional view illustrating a layer 103 containing a sublimable material.

FIG. 3 is a schematic cross-sectional view illustrating a layer 103 containing a sublimable material.

As illustrated in FIG. 2, the processing apparatus 1 is provided with a housing 2, a carry-in section 3, a carry-out section 4, a chemical liquid processing section 5, a film forming section 6, a removing section 7, a transport section 8, and a control section 9.

The housing 2 has a box shape. The carry-in section 3, the carry-out section 4, the chemical liquid processing section 5, the film forming section 6, the removing section 7, and the transport section 8 are provided inside the housing 2.

Furthermore, the housing 2 is provided with an opening-closing door (not illustrated) and carry-in of the carrier 101 to the carry-in section 3 or carry-out of the carrier 101 from the carry-out section 4 is performed through the opening-closing door.

The housing 2 has an air-tight mechanism to an extent that particles can be prevented from intruding from the outside.

Moreover, a gas supply device for supplying air and the like is provided and a pressure inside the housing 2 can be higher than that of the outside of the housing 2. If the pressure inside the housing 2 is higher than the pressure of the outside of the housing 2, the particles can be easily prevented from intruding from the outside.

The carry-in section 3 houses the carrier 101 in which the plurality of workpieces 100 before processing are housed.

The carry-out section 4 houses the carrier 101 in which the plurality of workpieces 100 after processing are housed.

The chemical liquid processing section 5 immerses the carrier 101 in which the plurality of workpieces 100 are housed in a chemical liquid and processes a surface of the workpiece 100.

For example, the chemical liquid processing section 5 removes ashing residuals, particles, a resist mask, and the like from the surface of the workpiece 100. Furthermore, for example, the chemical liquid processing section 5 can perform etching of a film formed on the surface of the workpiece 100.

The chemical liquid can be appropriately selected depending on an object of the processing. For example, the chemical liquid can be dilute hydrofluoric acid (DHF), buffered hydrofluoric acid (BHF), a mixture of ammonium hydroxide, hydrogen peroxide, and water (SC-1), a mixture of hydrochloric acid, hydrogen peroxide, and water (SC-2), ammonia hyperhydration (APM), hydrochloric acid hyperhydration (HPM), sulfuric acid hyperhydration (SPM), and the like. However, the chemical liquid is not limited to the examples.

For example, the chemical liquid processing section 5 can be provided with a processing tank 5a and a lifting section 5b.

The chemical liquid is housed inside the processing tank 5a. For example, the chemical liquid is supplied inside the processing tank 5a through a factory pipe (not illustrated) and the like. Furthermore, the chemical liquid after using is discharged from the inside of the processing tank 5a through the factory pipe (not illustrated) and the like.

The lifting section 5b holds the holding section 101b of the carrier 101, lowers the held carrier 101, and immerses the carrier 101 in the chemical liquid inside the processing tank 5a.

Furthermore, the lifting section 5b holds the holding section 101b of the carrier 101 and lifts the held carrier 101, pulls the carrier 101 up from the chemical liquid inside the processing tank 5a.

The film forming section 6 removes the chemical liquid from the surface of the workpiece 100 that is processed in the chemical liquid processing section 5 and forms the layer 103 containing the sublimable material having an appropriate thickness on the surface of the workpiece 100 in which the chemical liquid is removed.

The removing section 7 removes the layer 103 containing the sublimable material formed on the surface of the workpiece 100.

Moreover, details of the film forming section 6 and the removing section 7 are described below.

The transport section 8 transports the carrier 101 in which the plurality of workpieces 100 are housed.

The transport section 8 is provided with a body section 8a, an arm section 8b, a moving section 8c, and a chuck 8d.

The body section 8a is provided on the moving section 8c. The arm section 8b is provided on the body section 8a. The body section 8a is provided with a driving device and the driving device moves the body section 8a on the moving section 8c. Furthermore, expanding and contracting operations, or a rotating operation of the arm section 8b, a rotating operation of the chuck 8d, and the like can be performed by the driving device provided in the body section 8a.

The chuck 8d is provided in one end of the arm section 8b and the chuck 8d can hold the holding section 101b of the carrier 101.

The arm section 8b has a multi-articulated structure and can move the chuck 8d in a direction protruding from the body section 8a or a direction returning to a side of the body section 8a. Thus, the arm section 8b can perform delivery of the carrier 101 that is held by contracting the arm or receiving of the carrier 101.

For example, the chuck 8d can have a mechanical holding device.

The control section 9 controls an operation of each element provided in the processing apparatus 1.

For example, the control section 9 controls the chemical liquid processing section 5 and performs a desired process by supplying the chemical liquid on surface of the workpiece 100.

For example, the control section 9 controls the film forming section 6 and supplies a rinse liquid 102 (corresponding to an example of a first fluid), a pre-processing liquid 104 (corresponding to a second fluid), and a fluid 105 containing the sublimable material to the surface of the workpiece 100.

Furthermore, for example, the control section 9 controls the film forming section 6 and forms the layer 103 containing the sublimable material by drying the fluid 105 containing the sublimable material on the surface of the workpiece 100.

At this time, the control section 9 controls a gas supply section 65 and makes a thickness t of the layer 103 containing the sublimable material that is formed be within an appropriate range.

Moreover, as illustrated in FIG. 3, the thickness t of the layer 103 containing the sublimable material is a length from a top surface of a convex section 100a1 in an irregular pattern 100a to a surface of the layer 103 containing the sublimable material.

For example, the control section 9 controls the removing section 7 and removes the layer 103 containing the sublimable material formed on the surface of the workpiece 100.

For example, the control section 9 controls the transport section 8 and transports the carrier 101 in which the plurality of workpieces 100 are housed.

Moreover, operations of the film forming section 6 and the removing section 7 are described below in detail.

Next, the film forming section 6 is further illustrated.

Figure 4:
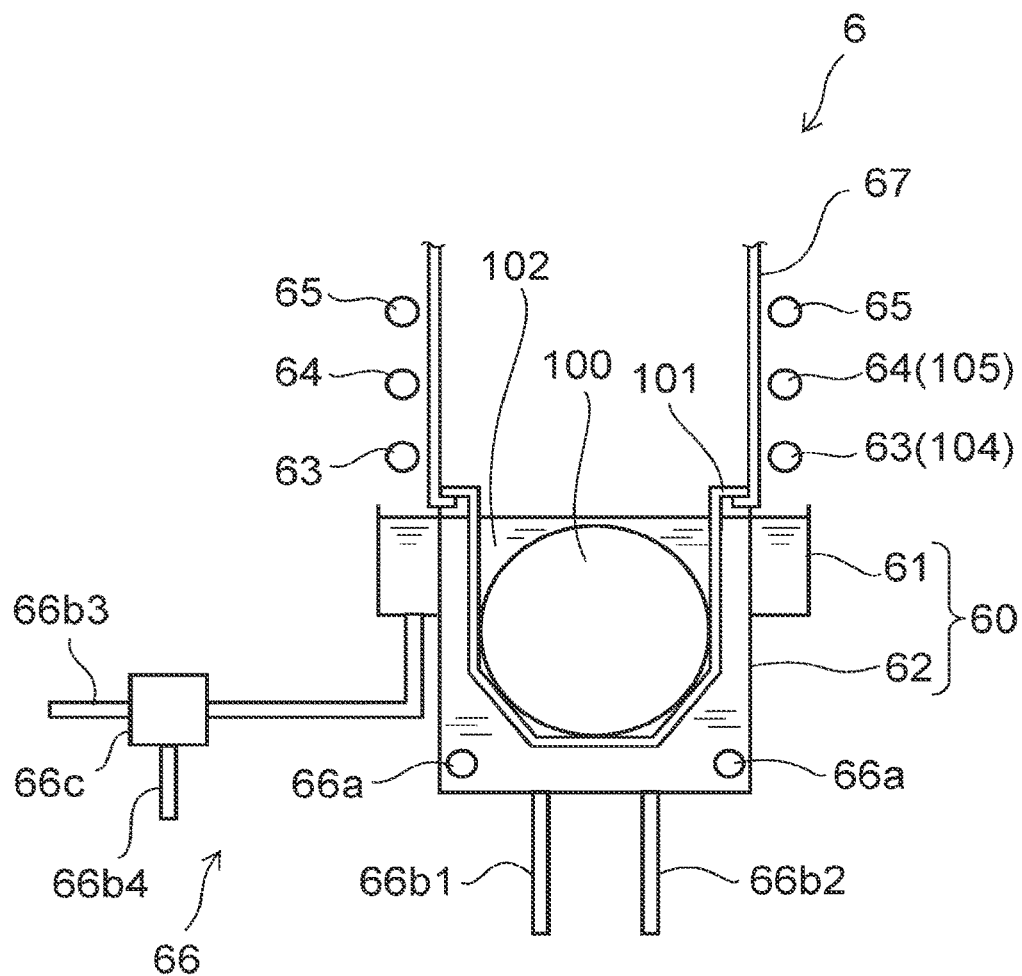
FIG. 4 is a schematic view illustrating the film forming section 6.

FIG. 4 is a schematic view illustrating the film forming section 6.

As illustrated in FIG. 4, the film forming section 6 is provided with a processing tank 60, a pre-processing liquid supply section 63 (corresponding to an example of a third supply section), a fluid supply section 64 (corresponding to an example of a second supply section), the gas supply section 65, a piping section 66, and a lifting section 67.

The processing tank 60 has an inner tank 62 and an outer tank 61.

An upper end portion of the inner tank 62 is opened. The rinse liquid 102 is housed inside the inner tank 62. Furthermore, the carrier 101 in which the plurality of workpieces 100 are housed is housed inside the inner tank 62. That is, the carrier 101 in which the plurality of workpieces 100 are housed can be immersed in the rinse liquid 102 housed inside the inner tank 62.

The outer tank 61 is provided so as to surround the upper end portion of the inner tank 62. The outer tank 61 recovers the rinse liquid 102 overflowing from the upper end portion of the inner tank 62.

For example, the rinse liquid 102 can be ultrapure water and the like.

The pre-processing liquid supply section 63 is provided upward the processing tank 60.

The pre-processing liquid supply section 63 supplies the pre-processing liquid 104 to the surfaces of the plurality of workpieces 100 that are pulled up from the processing tank 60.

The pre-processing liquid 104 is supplied to facilitate the formation of the layer 103 containing the sublimable material.

For example, the fluid 105 containing the sublimable material described below is easily attached to the surface of the workpiece 100 by replacing the rinse liquid 102 that is in the surface of the workpiece 100 with the pre-processing liquid 104.

Thus, it is preferable that the pre-processing liquid 104 has a high affinity with the fluid 105 containing the sublimable material.

For example, the pre-processing liquid 104 can be isopropyl alcohol (IPA) and the like.

For example, the pre-processing liquid supply section 63 can include nozzles that eject the pre-processing liquid 104 onto the surfaces of the plurality of workpieces 100, a pump that supplies the pre-processing liquid 104 to the nozzles, and a control valve that controls supply, stop, a flow rate, and the like of the pre-processing liquid 104.

Moreover, the pre-processing liquid supply section 63 is not necessarily required and can be omitted.

However, if the pre-processing liquid supply section 63 is provided, it is possible to easily perform the attachment of the fluid 105 containing the sublimable material and the control of the thickness t of the layer 103 containing the sublimable material.

The fluid supply section 64 is provided upward the pre-processing liquid supply section 63.

The fluid supply section 64 supplies the fluid 105 containing the sublimable material on the surfaces of the plurality of workpieces 100 to which the pre-processing liquid 104 is supplied.

Moreover, if the pre-processing liquid supply section 63 is not provided, the fluid supply section 64 supplies the fluid 105 containing the sublimable material on the surfaces of the plurality of workpieces 100 to which the rinse liquid 102 is supplied.

The fluid 105 containing the sublimable material contains the sublimable material and can have fluidity.

For example, the fluid 105 containing the sublimable material can be a solution containing the sublimable material or the melted sublimable material.

For example, the fluid supply section 64 can include nozzles that eject the fluid 105 containing the sublimable material onto the surfaces of the plurality of workpieces 100, a pump that supplies the fluid 105 containing the sublimable material to the nozzles, and a control valve that controls supply, stop, a flow rate, and the like of the fluid 105 containing the sublimable material.

The sublimable material has a melting point that is a room temperature or more and is sublimated at an atmosphere under the atmospheric pressure.

The sublimable material contains at least one type selected from a group formed of ammonium silicofluoride $((NH_4)_2SiF_6)$, 1,2,3-benzotriazole, 2-methyl naphthalene, paradichlorobenzene, and methyl naphthalene.

In a case of the melted sublimable material, for example, the sublimable material may be heated to the melting point or more. For example, the sublimable material is melted and the melted sublimable material can be supplied to the surface of the workpiece 100 by heating at least one of the supply section, the pipe, and the nozzles of the fluid 105 containing the sublimable material (not illustrated) to the melting point or more of the sublimable material.

In a case of the solution containing the sublimable material, the sublimable material may be melted in a solvent.

For example, the solvent can include at least one type selected from a group formed of pure water, aliphatic hydrocarbons, aromatic hydrocarbons, esters, alcohol, and ether.

Specifically, the solvent can include at least one type selected from a group formed of pure water, methanol, ethanol, IPA, butanol, ethylene glycol, propylene glycol, NMP, DMF, DMA, DMSO, hexane, toluene, propylene glycol monomethyl ether acetate (PGMEA), propylene glycol monomethyl ether (PGME), propylene glycol monopropyl ether (PGPE), propylene glycol monoethyl ether (PGEE), GBL, acetylene acetone, 3-pentanole, 2-heptanone, lactic acid ethyl, cyclohexanone, dibutyl ether, hydro fluoro ether (HFE), ethyl nonafluoro isobutyl ether, ethyl nonafluoro butyl ether, and m-xylene hexa fluorite.

The gas supply section 65 is provided upward the fluid supply section 64.

The gas supply section 65 supplies gas to the surfaces of the plurality of workpieces 100 to which the fluid 105 containing the sublimable material is supplied and performs dry of the fluid 105 containing the sublimable material.

In this case, the layer 103 containing the sublimable material is formed by drying the fluid 105 containing the sublimable material that is on each surface of the plurality of workpieces 100.

For example, the gas supply section 65 can include nozzles that eject gas onto the surfaces of the plurality of workpieces 100, a pressure tank that supplies the gas to the nozzles, and a control valve that controls supply, stop, a flow velocity, a flow rate, and the like of the gas.

Types of gas are not specifically limited and the gas may be unlikely to react with the workpiece 100 or the sublimable material, and the like.

For example, the gas can be nitrogen gas, air, inert gas such as argon, and the like.

A moisture amount contained in the gas is not specifically limited and it is preferable that the moisture amount is as small as possible. That is, it is preferable that the gas is dry.

Furthermore, a temperature of the gas is not specifically limited as long as the temperature is the melting point or less of the sublimable material and it is preferable that the temperature is the room temperature or more to promote the dry of the fluid 105 containing the sublimable material.

Furthermore, the gas supply section 65 controls the thickness t of the layer 103 containing the sublimable material that is formed by controlling at least one of the flow velocity and the flow rate of the gas.

Moreover, details regarding the control of the thickness t of the layer 103 containing the sublimable material are described below.

The piping section 66 is provided with a supply pipe 66a (corresponding to an example of a first supply section), drain pipes 66b1 to 66b4, and a switching valve 66c.

The supply pipe 66a is provided on a bottom surface side of the inside of the inner tank 62. For example, the supply pipe 66a is connected to the factory pipe (not illustrated) and the like and carries the rinse liquid 102 supplied from the factory pipe (not illustrated) and the like in the inside of the inner tank 62. For example, the supply pipe 66a includes nozzles and the like and can eject the rinse liquid 102 onto the inside of the inner tank 62.

The drain pipe 66b1 is connected to the bottom surface of the inner tank 62. The drain pipe 66b1 discharges, for example, the rinse liquid 102 that is in the inside of the inner tank 62.

The drain pipe 66b2 is connected to the bottom surface of the inner tank 62. The drain pipe 66b2 discharges, for example, the pre-processing liquid 104 and the fluid 105 containing the sublimable material that are in the inside of the inner tank 62.

The drain pipe 66b3 is connected to the bottom surface of the outer tank 61 through the switching valve 66c. The drain pipe 66b3 discharges the rinse liquid 102 that is in the inside of the outer tank 61.

The drain pipe 66b4 is connected to the bottom surface of the outer tank 61 through the switching valve 66c. The drain pipe 66b4 discharges the pre-processing liquid 104 and the fluid 105 containing the sublimable material in the inside of the outer tank 61.

Moreover, it is possible to separately provide the drain pipe for discharging the pre-processing liquid 104 and the drain pipe for discharging the fluid 105 containing the sublimable material.

For example, the switching valve 66c can be a three-way valve and the like.

The lifting section 67 holds the holding section 101b of the carrier 101, lowers the held carrier 101, and immerses the carrier 101 in the rinse liquid 102 of the inside of the inner tank 62.

Furthermore, the lifting section 67 holds the holding section 101b of the carrier 101, lifts the held carrier 101, and pulls up the carrier 101 in the rinse liquid 102 of the inside of the inner tank 62.

Furthermore, the lifting section 67 makes the carrier 101 pass through a region to which the pre-processing liquid 104 is supplied by the pre-processing liquid supply section 63, a region to which the fluid 105 containing the sublimable material is supplied by the fluid supply section 64, and a region to which the gas is supplied by the gas supply section 65 by further lifting the carrier 101.

Next, the control of the thickness t of the layer 103 containing the sublimable material will be described.

As a method for forming a film-shaped body on the surface of the workpiece 100, a wafer spin method is known.

If the solvent containing the sublimable material is applied to the surface of the workpiece 100 using the wafer spin method, it is possible to appropriately form the thickness t of the layer 103 containing the sublimable material.

However, if the wafer spin method is used, the productivity is low.

In this case, if a batch processing method that immerses the plurality of workpieces 100 at one time in the solution containing the sublimable material is used, it is possible to improve the productivity.

However, simply, if the batch processing method is used, it is difficult to form the layer 103 containing the sublimable material having an appropriate thickness on the surfaces of the plurality of workpieces 100 that are housed in an erected state.

In this case, if the thickness t of the layer 103 containing the sublimable material is too thin, there is a concern that a region in which the rinse liquid 102 and the like cannot be removed by occurrence of unevenness.

If the thickness t of the layer 103 containing the sublimable material is too thick, there is a concern that a removing time in the removing section 7 is lengthened and residuals occur.

Thus, in the processing apparatus 1, the gas supply section 65 is provided, the fluid 105 containing the sublimable material that is on the surface of the workpiece 100 is dried, and the thickness t of the layer 103 containing the sublimable material that is formed is controlled.

According to the findings obtained by the present inventors, as indicated in the following Expression 1, the thickness t of the layer 103 containing the sublimable material can be controlled by a concentration of the fluid 105 containing the sublimable material, a viscosity of the fluid 105 containing the sublimable material, and a flow velocity of the gas on the surface of the workpiece 100.

$$\text{film thickness} \propto \frac{(\text{concentration})^\alpha (\text{viscosity})^\beta}{(\text{flow velocity})^\mu} \quad (1)$$

In this case, if compositions of the fluid 105 containing the sublimable material are determined, it is possible to know the concentration of the fluid 105 containing the sublimable material and the viscosity of the fluid 105 containing the sublimable material in advance.

Thus, it is possible to obtain the flow velocity of the gas on the surface of the workpiece 100 for forming the layer 103 containing the sublimable material having an appropriate thickness and the flow rate or the flow velocity, and the like of the gas supplied by the gas supply section 65 supplied by the gas supply section 65 by performing an experiment or a simulation.

Figure 5:
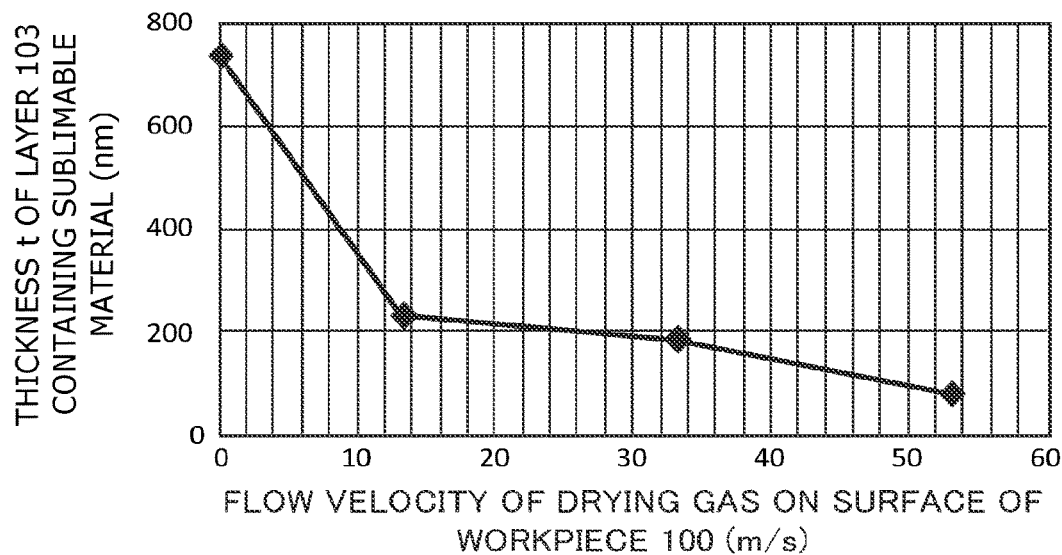
FIG. 5 is a graph illustrating a relationship between the flow velocity of the gas on the surface of the workpiece 100 and the thickness t of the layer 103 containing the sublimable material.

FIG. 5 is a graph illustrating a relationship between the flow velocity of the gas on the surface of the workpiece 100 and the thickness t of the layer 103 containing the sublimable material.

In this case, the viscosity of the fluid 105 containing the sublimable material is approximately 1.77 mPas.

The concentration of the fluid 105 containing the sublimable material is approximately 6.4 wt %.

As illustrated in FIG. 5, if the flow velocity of the gas on the surface of the workpiece 100 is changed, it is possible to change the thickness t of the layer 103 containing the sublimable material.

Furthermore, the flow velocity of the gas on the surface of the workpiece 100 can be controlled by controlling at least one of the flow velocity and the flow rate of the gas in the gas supply section 65.

Thus, it is possible to control the thickness t of the layer 103 containing the sublimable material that is formed by controlling at least one of the flow velocity and the flow rate in the gas supply section 65.

Thus, the thickness t of the layer 103 containing the sublimable material can be made be an appropriate range by controlling the flow velocity of the gas on the surfaces of the plurality of workpieces 100 by the gas supply section 65.

For example, as illustrated in FIG. 5, if the flow velocity of the gas on the surface of the workpiece 100 is 10 m/s or more and 40 m/s or less, it is possible to form the layer 103 containing the sublimable material having an appropriate thickness.

Figure 6:
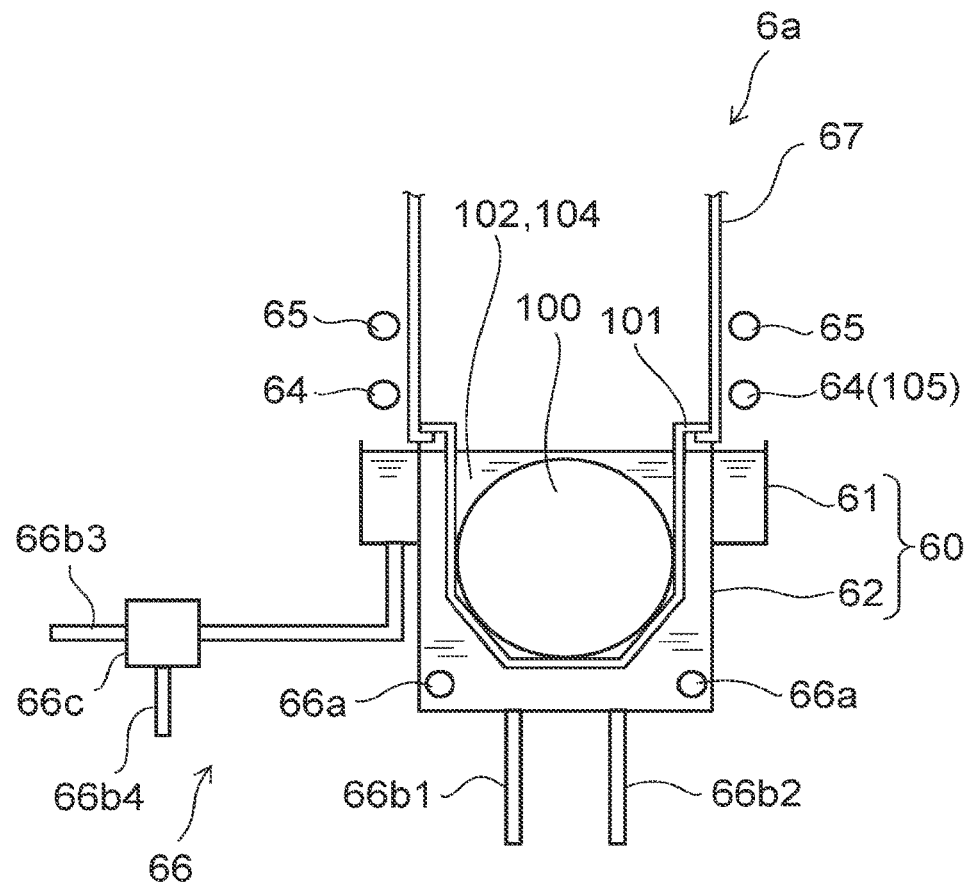
FIG. 6 is a schematic view illustrating a film forming section 6a according to another embodiment.

FIG. 6 is a schematic view illustrating a film forming section 6a according to another embodiment.

As illustrated in FIG. 6, the film forming section 6a is provided with a processing tank 60, a fluid supply section 64, a gas supply section 65, a piping section 66, and a lifting section 67.

That is, the film forming section 6a is not provided with a pre-processing liquid supply section 63 upward the processing tank 60.

In a case of the film forming section 6a, the pre-processing liquid 104 is supplied from a supply pipe 66a to the inside of an inner tank 62.

That is, first, a rinse liquid 102 is supplied to the inside of the inner tank 62 and a carrier 101 in which a plurality of workpieces 100 in the rinse liquid 102 are housed is immersed. Next, the rinse liquid 102 is discharged from the inside of the inner tank 62. Next, the pre-processing liquid 104 is supplied to the inside of the inner tank 62 and the carrier 101 in which the plurality of workpieces 100 are housed is immersed in the pre-processing liquid 104.

As described above, the pre-processing liquid 104 is supplied to the surfaces of the plurality of workpieces 100.

Moreover, it is possible to provide the pre-processing liquid supply section 63 inside the inner tank 62.

Figure 7:
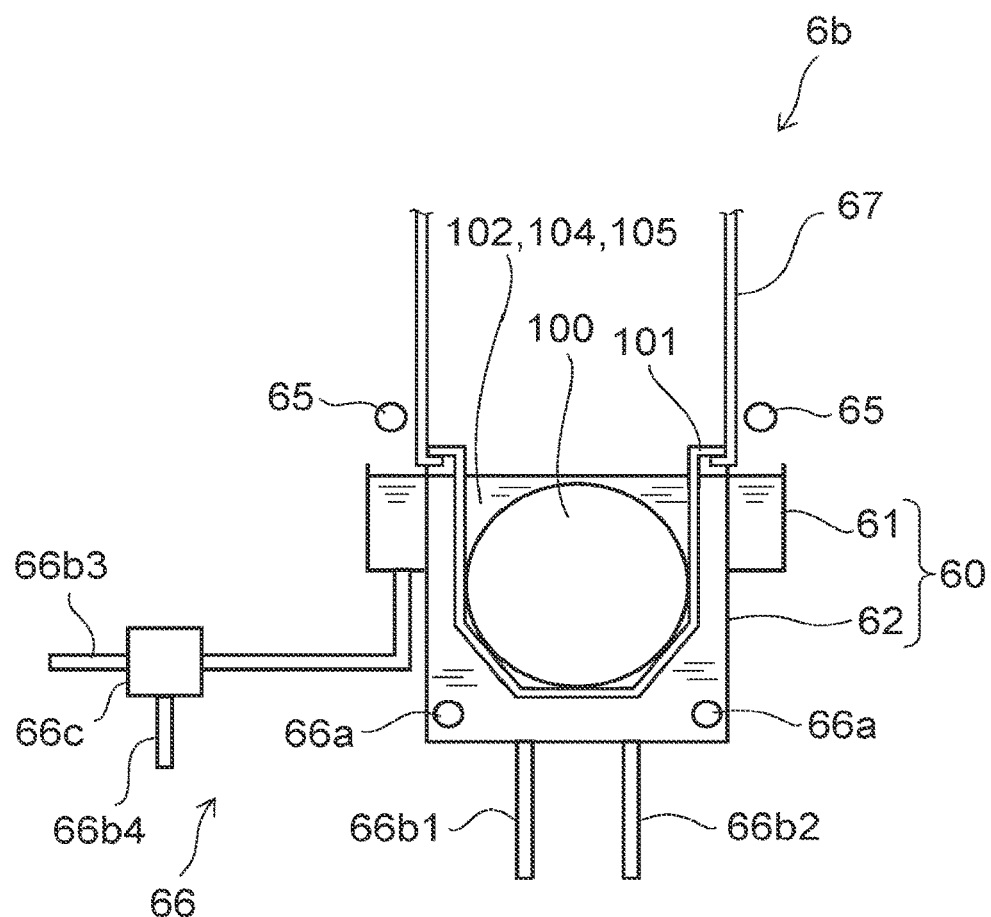
FIG. 7 is a schematic view illustrating a film forming section 6b according to another embodiment.

FIG. 7 is a schematic view illustrating a film forming section 6b according to another embodiment.

As illustrated in FIG. 7, the film forming section 6b is provided with a processing tank 60, a gas supply section 65, a piping section 66, and a lifting section 67.

That is, the film forming section 6b is not provided with the pre-processing liquid supply section 63 and a fluid supply section 64 upward the processing tank 60.

In a case of the film forming section 6b, the pre-processing liquid 104 and the fluid 105 containing the sublimable material are supplied from the supply pipe 66a to the inside of the inner tank 62.

That is, first, the rinse liquid 102 is supplied to the inside of the inner tank 62 and the carrier 101 in which a plurality of workpieces 100 are housed is immersed in the rinse liquid 102. Next, the rinse liquid 102 is discharged from the inside of the inner tank 62. Next, the pre-processing liquid 104 is supplied to the inside of the inner tank 62 and the carrier 101 in which the plurality of workpieces 100 are housed is immersed in the pre-processing liquid 104. Next, the pre-processing liquid 104 is discharged from the inside of the inner tank 62. Next, the fluid 105 containing the sublimable material is supplied to the inside of the inner tank 62 and the carrier 101 in which the plurality of workpieces 100 are housed is immersed in the fluid 105 containing the sublimable material.

As described above, the pre-processing liquid 104 and the fluid 105 containing the sublimable material are sequentially supplied to the surfaces of the plurality of workpieces 100.

Moreover, it is possible to provide the pre-processing liquid supply section 63 and the fluid supply section 64 inside the inner tank 62.

Next, a removing section 7 is further illustrated.

Figure 8:
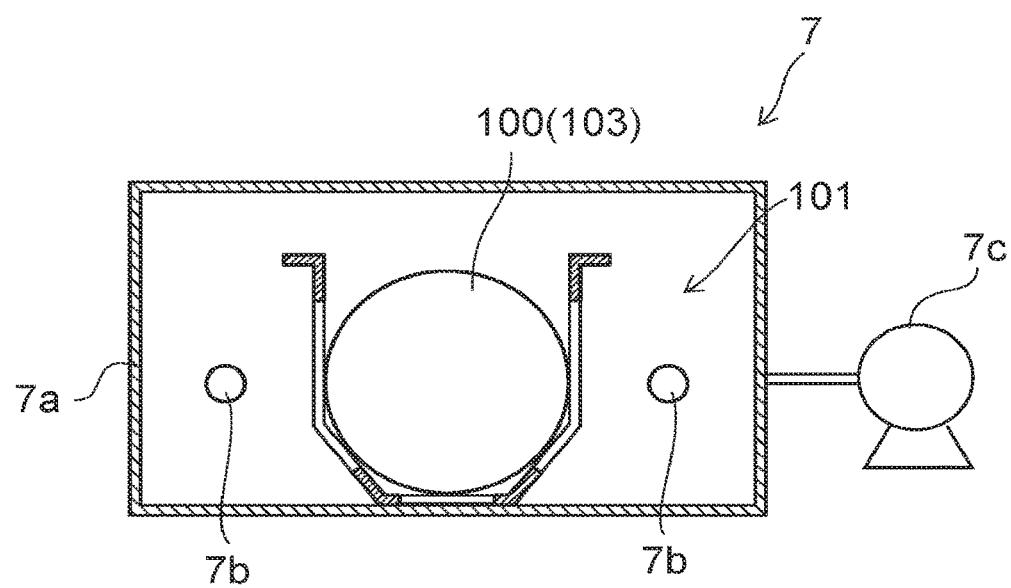
FIG. 8 is a schematic cross-sectional view illustrating the removing section 7.

FIG. 8 is a schematic cross-sectional view illustrating the removing section 7.

As illustrated in FIG. 8, the removing section 7 is provided with a container 7a, a sublimation section 7b, and an exhaust section 7c.

The container 7a has a box-shape and an air-tight structure.

The container 7a is provided with an opening for carry-in and carry-out the carrier 101 in which a plurality of workpieces 100 are housed and a door for performing opening and closing the opening.

The sublimation section 7b removes a layer 103 containing the sublimable material that is each surface of the plurality of workpieces 100 housed in the carrier 101 by sublimating the layer 103.

A configuration of the sublimation section 7b is not specifically limited and may be provided as long as the layer 103 containing the sublimable material is sublimated.

For example, the sublimation section 7b can be a heating device, a light irradiation device, an electronic beam irradiation device, a device for supplying a gas dissolving a solid, and the like.

The exhaust section 7c exhausts the inside of the container 7a and makes the inside of the container 7a be an atmosphere lower than the atmospheric pressure.

For example, the exhaust section 7c makes the pressure of the inside of the container 7a be appropriately 0.1 Pa to 20 Pa.

For example, the exhaust section 7c can be a vacuum pump and the like.

Moreover, if the layer 103 containing the sublimable material can be sublimated under the atmospheric pressure, it is possible to omit the container 7a and the exhaust section 7c.

However, if the container 7a and the exhaust section 7c are provided, and the layer 103 containing the sublimable material is sublimated under a reduced pressure atmosphere, it is possible to reduce a removing time.

Next, a processing method according to the embodiment is illustrated together with the operation of the processing apparatus 1. First, the carrier 101 in which the plurality of workpieces 100 before the processing are housed is carried in the carry-in section 3.

Next, the carrier 101 is transported from the carry-in section 3 to the chemical liquid processing section 5 by the transport section 8.

Next, the surface of the workpiece 100 is processed by the chemical liquid processing section 5.

For example, first, the carrier 101 is immersed in the chemical liquid inside of the processing tank 5a by the lifting section 5b.

Subsequently, the carrier 101 is pulled up from the chemical liquid inside the processing tank 5a by the lifting section 5b.

As described above, the chemical liquid is supplied and a desired processing is performed simultaneously on the surfaces of the plurality of workpieces 100 housed in the carrier 101.

Next, the carrier 101 is transported from the chemical liquid processing section 5 to the film forming section 6 by the transport section 8.

Next, the chemical liquid is removed from the surface of the workpiece 100 by the film forming section 6 and the layer 103 containing the sublimable material having an appropriate thickness is formed on the surface of the workpiece 100 in which the chemical liquid is removed.

For example, first, the carrier 101 is immersed in the rinse liquid 102 of the inside of the inner tank 62 by the lifting section 67.

Subsequently, the carrier 101 is pulled out from the rinse liquid 102 of the inside of the inner tank 62 by the lifting section 67.

Subsequently, the carrier 101 is further lifted by the lifting section 67 and the pre-processing liquid 104 is supplied to the surfaces of the plurality of workpieces 100 by the pre-processing liquid supply section 63.

Subsequently, the carrier 101 is further lifted by the lifting section 67 and the fluid 105 containing the sublimable material is supplied to the surfaces of the plurality of workpieces 100 by the fluid supply section 64.

Subsequently, the carrier 101 is further lifted by the lifting section 67, the gas is supplied to the surfaces of the plurality of workpieces 100 by the gas supply section 65, and the layer 103 containing the sublimable material is formed each surface of the plurality of workpieces 100.

At this time, the thickness t of the layer 103 containing the sublimable material that is formed is controlled by controlling at least one of the flow velocity and the flow rate of the gas in the gas supply section 65.

Moreover, as described above, it is possible to supply the rinse liquid 102 and the pre-processing liquid 104 to the surfaces of the plurality of workpieces 100 in the inside of the inner tank 62.

For example, first the rinse liquid 102 is supplied to the inside of the inner tank 62 and the carrier 101 in which the plurality of workpieces 100 are housed is immersed in the rinse liquid 102. Next, the rinse liquid 102 is discharged from the inside of the inner tank 62. Next, the pre-processing liquid 104 is supplied to the inside of the inner tank 62 and the carrier 101 in which the plurality of workpieces 100 are housed is immersed in the pre-processing liquid 104.

Furthermore, it is possible to supply the rinse liquid 102, the pre-processing liquid 104, and the fluid 105 containing the sublimable material to the surfaces of the plurality of workpieces 100 in the inside of the inner tank 62.

For example, first, the rinse liquid 102 is supplied to the inside of the inner tank 62 and the carrier 101 in which the plurality of workpieces 100 are housed is immersed in the rinse liquid 102. Next, the rinse liquid 102 is discharged from the inside of the inner tank 62. Next, the pre-processing liquid 104 is supplied to the inside of the inner tank 62 and the carrier 101 in which the plurality of workpieces 100 are housed is immersed in the pre-processing liquid 104. Next, the pre-processing liquid 104 is disposed from the inside of the inner tank 62. Next, the fluid 105 containing the sublimable material is supplied to the inside of the inner tank 62 and the carrier 101 in which the plurality of workpieces 100 are housed is immersed in the fluid 105 containing the sublimable material.

Next, the carrier 101 is transported from the film forming section 6 to the removing section 7 by the transport section 8.

Next, the layer 103 containing the sublimable material formed on each surface of the plurality of workpieces 100 is removed by the removing section 7.

For example, first, the inside of the container 7a in which the carrier 101 is carried is at atmosphere of reduced pressure more than the atmospheric pressure by the exhaust section 7c.

For example, the pressure of the inside of the container 7a is approximately 0.1 Pa to 20 Pa by the exhaust section 7c. Subsequently, the layer 103 containing the sublimable material that is in the surface of the workpiece 100 is removed by being sublimated by heating the layer 103 containing the sublimable material by the sublimation section 7b.

For example, the layer 103 containing the sublimable material is heated by the sublimation section 7b such that the layer 103 containing the sublimable material is approximately 50° C. to 150° C.

Next, the carrier 101 in which the plurality of workpieces 100 after processing are housed is transported from the removing section 7 to the carry-out section 4 by the transport section 8.

Next, the carrier 101 in which the plurality of workpieces 100 after processing are housed is transported from the carry-out section 4 to the outside of the processing apparatus 1.

As described above, the processing method according to the embodiment can include the following processes.

A first supply process in which the first fluid (for example, the rinse liquid 102) is supplied to the surfaces of the plurality of workpieces 100.

A second supply process in which the fluid 105 containing the sublimable material is supplied to the surfaces of the plurality of workpieces 100 to which the first fluid is supplied.

A gas supply process in which the gas is supplied to the surfaces of the plurality of workpieces 100 to which the fluid 105 containing the sublimable material is supplied.

In the gas supply process, the thickness of the layer 103 containing the sublimable material formed on each surface of the plurality of workpieces 100 is controlled by controlling the flow velocity of the gas on each surface of the plurality of workpieces 100.

A sublimation removing process in which the layer 103 containing the sublimable material formed on the surface of the workpiece 100 is removed by being sublimated from the workpiece 100.

In the sublimation removing process, both of pressure reduction or heating, and pressure reduction and heating the workpiece 100 are performed.

Furthermore, it is possible to further include a third supply process for supplying a second fluid (for example, the pre-processing liquid 104) having a high affinity with the fluid 105 containing the sublimable material on the surfaces of the plurality of workpieces 100 to which the first fluid is supplied.

In this case, in the second supply process described above, the fluid 105 containing the sublimable material is supplied to the surfaces of the plurality of workpieces 100 to which the second fluid is supplied.

The second fluid can be isopropyl alcohol.

Moreover, since contents in each process can be similar to the above description, detailed description will be omitted.

Next, a manufacturing method of the electronic device according to the embodiment will be illustrated.

As the manufacturing method of the electronic device, for example, a manufacturing method of a semiconductor device, or a manufacturing method of a flat panel display, and the like can be illustrated. For example, in the manufacturing method of the semiconductor device, there are a process for forming a pattern on a surface of a semiconductor wafer by forming a film, applying resist, exposing, developing, etching, removing the resist, and the like, a process for inspection, a process for cleaning, a process for heat treatment, a process for carrying in impurity, a process for dispersing, a process for flattening, and the like in a so-called pre-processing. Furthermore, there are an assembling process such as dicing, mounting, bonding, and sealing, an inspection process for inspecting a function or reliability, and the like in a so-called post-processing.

In this case, for example, in the cleaning process, it is possible to use the processing apparatus 1 or the processing method described above.

For example, it is possible to remove an organic material or metal, and the like attached to the surface of the semiconductor wafer using the processing apparatus 1 or the processing method described above.

Moreover, since a known technique can be applied to each process other than the processing apparatus 1 or the processing method described above, detailed description will be omitted.

According to the manufacturing method of the electronic device according to the embodiment, it is possible to improve the productivity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A processing apparatus comprising:
a processing tank which houses a carrier inside, a plurality of workpieces being held in a state of being upright at a predetermined interval inside the carrier, the plurality of workpieces being held in parallel, the carrier having a lower region configured to support a plurality workpieces in the lower region, at least one opening being provided on a side surface of the carrier;
a first supply nozzle in communication with the at least one opening and configured to supply via the at least one opening a first fluid on surfaces of the plurality of workpieces;
a second supply nozzle in communication with the at least one opening and configured to supply via the at least one opening a fluid containing a sublimable material on the surfaces of the plurality of workpieces to which the first fluid is supplied;
a gas supply section configured to supply via the at least one opening gas on the surfaces of the plurality of workpieces to which a fluid containing the sublimable material is supplied, the gas supply section including a nozzle and a control valve; and
a sublimation section configured to sublimate a layer containing the sublimable material formed on each surface of the plurality of workpieces, the sublimation section being at least one selected from the group consisting of a heating device, a light irradiation device, an electronic beam irradiation device, and a device for supplying a gas dissolving a solid,
wherein the control valve is configured to control at least one of the flow velocity and a flow rate of the gas supplied toward surfaces of the plurality of workpieces,
the second supply nozzle being provided above the processing tank, the gas supply section being provided above the second supply nozzle, when the carrier rises, the plurality of workpieces sequentially pass through a region to which the fluid containing the sublimable material is supplied, and a region to which the gas is supplied.

2. The apparatus according to claim 1,
wherein the control valve is configured to control the flow velocity of the gas to be 10 m/s or more and 40 m/s or less on each surface of the plurality of workpieces.

3. The apparatus according to claim 1,
wherein the control valve is configured to control the flow velocity of the gas on each surface of the plurality of workpieces by controlling at least one of the flow velocity of the gas and the flow rate of the gas supplied to the plurality of workpieces.

4. The apparatus according to claim 1, further comprising:
a third supply nozzle configured to supply a second fluid on the surfaces of the plurality of workpieces to which the first fluid is supplied, the second fluid being supplied to the plurality of workpieces via the opening, an affinity of second fluid for the fluid containing the sublimable material is higher than that of the first fluid, the third supply nozzle being provided between the processing tank and the second supply nozzle,
wherein the second supply nozzle is configured to supply the fluid containing the sublimable material on the surfaces of the plurality of workpieces to which the second fluid is supplied.

5. The apparatus according to claim 1,
wherein the first fluid is a pure water.

6. The apparatus according to claim 1,
wherein the fluid containing the sublimable material is a solution containing the sublimable material or is the melted sublimable material.

7. The apparatus according to claim 1,
wherein the sublimable material has a melting point that is a room temperature or more and is sublimated at an atmosphere under the atmospheric pressure.

8. The apparatus according to claim 1,
wherein the sublimable material contains at least one type selected from a group formed of ammonium silicofluoride ((NH4)2SiF6), 1,2,3-benzotriazole, 2-methyl naphthalene, paradichlorobenzene, and methyl naphthalene.

9. The apparatus according to claim 6,
wherein the solution containing the sublimable material contains the sublimable material and a solvent, and
wherein the solvent contains at least one type selected from a group formed of the pure water, aliphatic hydrocarbon, aromatic hydrocarbon, ester, alcohol, and ether.

10. The apparatus according to claim 4,
wherein the second fluid is isopropyl alcohol.

11. The apparatus according to claim 1,
wherein the workpiece has a line-space pattern on the surface thereof and a pitch dimension of lines is 40 nm or less.

12. A processing apparatus comprising:
a processing tank which houses a carrier inside, a plurality of workpieces being held in a state of being upright at a predetermined interval inside the carrier, the plurality of workpieces being held in parallel, the carrier having a lower region configured to support a plurality workpieces in the lower region, at least one opening being provided on a side surface of the carrier;
a first supply nozzle in communication with the at least one opening and configured to supply via the at least one opening a first fluid on surfaces of the plurality of workpieces;
a second supply nozzle in communication with the at least one opening and configured to supply via the at least one opening a fluid containing a sublimable material on the surfaces of the plurality of workpieces to which the first fluid is supplied;
a gas supply section configured to supply via the at least one opening gas on the surfaces of the plurality of workpieces to which a fluid containing the sublimable material is supplied, the gas supply section including a nozzle and a control valve; and
a sublimation section configured to sublimate a layer containing the sublimable material formed on each surface of the plurality of workpieces, the sublimation section being at least one selected from the group consisting of a heating device, a light irradiation device, an electronic beam irradiation device, and a device for supplying a gas dissolving a solid,
a third supply nozzle configured to supply a second fluid on the surfaces of the plurality of workpieces to which the first fluid is supplied, an affinity of second fluid for the fluid containing the sublimable material is higher than that of the first fluid, the second fluid being isopropyl alcohol,
wherein the control valve is configured to control at least one of the flow velocity and a flow rate of the gas supplied toward surfaces of the plurality of workpieces, and
wherein the second supply nozzle is configured to supply the fluid containing the sublimable material on the surfaces of the plurality of workpieces to which the second fluid is supplied,
the third supply nozzle being provided above the processing tank, the second supply nozzle being provided above the third supply nozzle, the gas supply section being provided above the second supply nozzle, when the carrier rises, the plurality of workpieces sequentially pass through a region to which the second fluid is supplied, a region to which the fluid containing the sublimable material is supplied, and a region to which the gas is supplied.

* * * * *